US007511642B1

United States Patent
Han et al.

(10) Patent No.: US 7,511,642 B1
(45) Date of Patent: Mar. 31, 2009

(54) APPARATUS AND METHOD FOR BLOCK INTERLEAVING USING MIXED RADIX SYSTEM IN MB-OFDM

(75) Inventors: Young Sun Han, Seoul (KR); Peter Harliman, Seoul (KR); Seon Wook Kim, Gyeonggi-do (KR); Byung Gueon Min, Gyenggi-do (KR)

(73) Assignee: Mewtel Technology Inc., Seoul (KR)

( * ) Notice: Subject to any disclaimer, the term of this patent is extended or adjusted under 35 U.S.C. 154(b) by 0 days.

(21) Appl. No.: 11/934,492

(22) Filed: Nov. 2, 2007

(30) Foreign Application Priority Data

Sep. 28, 2007 (KR) .................. 10-2007-0098163

(51) Int. Cl.
*H03M 7/00* (2006.01)
(52) U.S. Cl. ........................................ 341/81; 375/130
(58) Field of Classification Search .............. 341/81; 375/130, 132, 324; 455/522; 370/338; 714/790, 714/795

See application file for complete search history.

(56) References Cited

U.S. PATENT DOCUMENTS

2005/0207351 A1* 9/2005 Inagawa .................. 370/252

\* cited by examiner

*Primary Examiner*—Rexford Barnie
*Assistant Examiner*—Joseph Lauture
(74) *Attorney, Agent, or Firm*—Rabin & Berdo, P.C.

(57) ABSTRACT

A block interleaving apparatus for block interleaving M-bit input streams to be transferred with a modulus k using a mixed radix system in a multi-band orthogonal frequency division multiplexing communication system, including an array processor having an array including M cells in which the number of columns is k and the number of rows is M/k. The array processor inputs the input streams from the bottom-right cell up to the top-left last cell in the horizontal direction, and, after the first bit of the input streams reaches the last cell, generates interleaved output streams by changing the output of the array processor from horizontal direction to vertical direction.

20 Claims, 5 Drawing Sheets

[Fig 1]
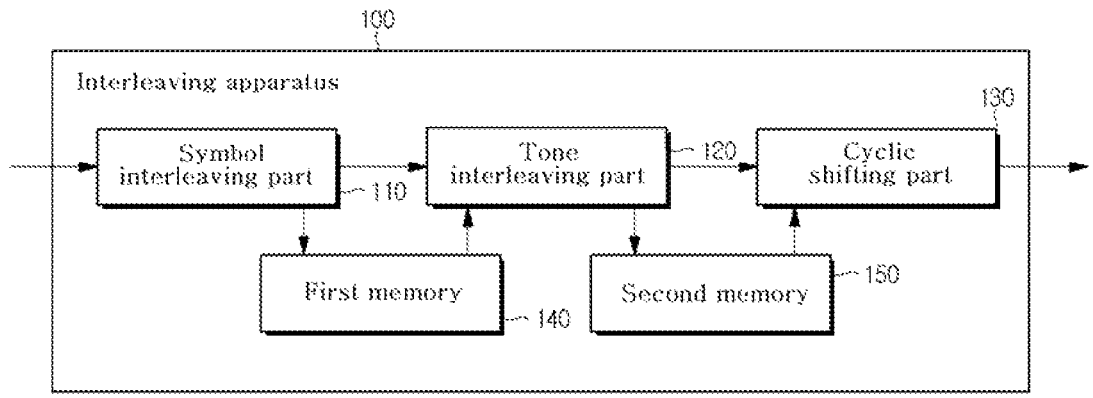
[Fig 2]
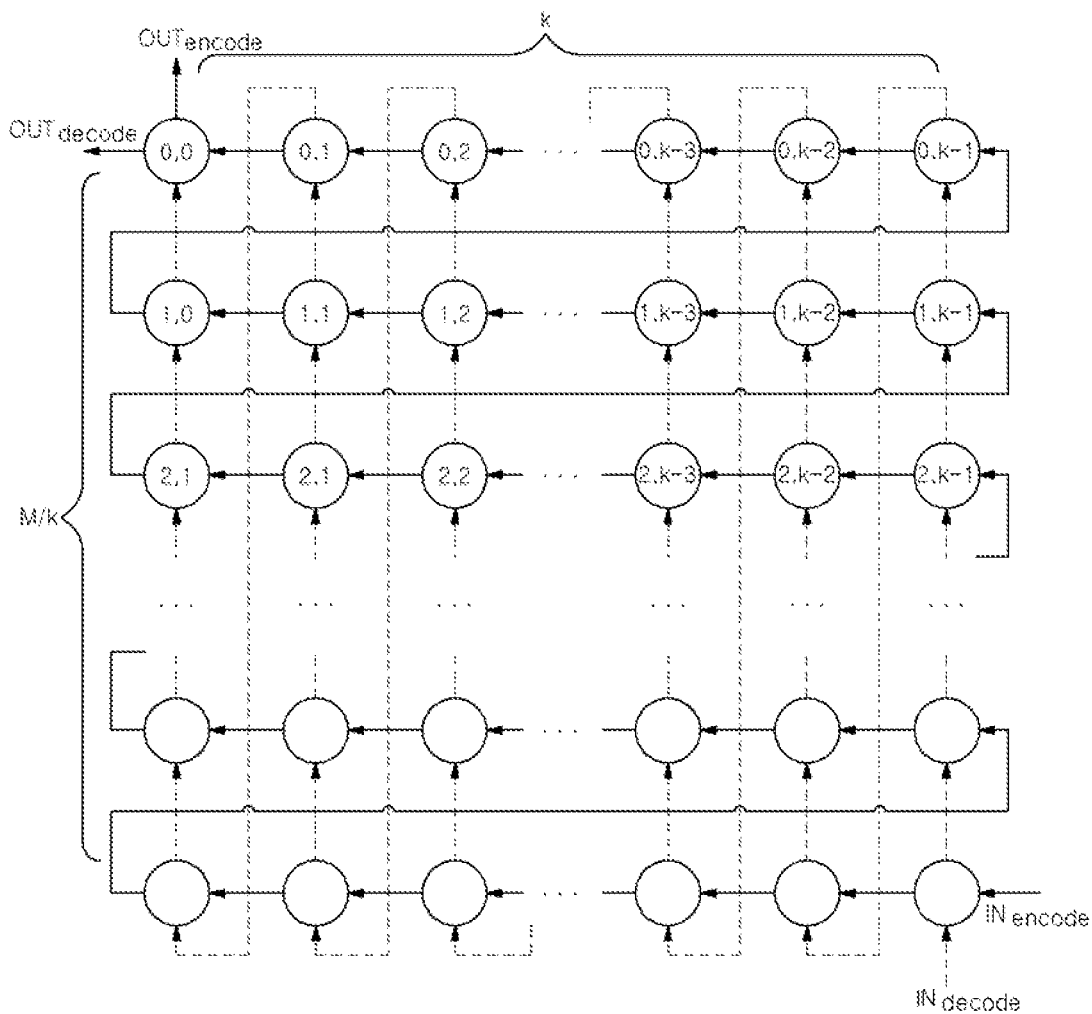

[Fig 3]
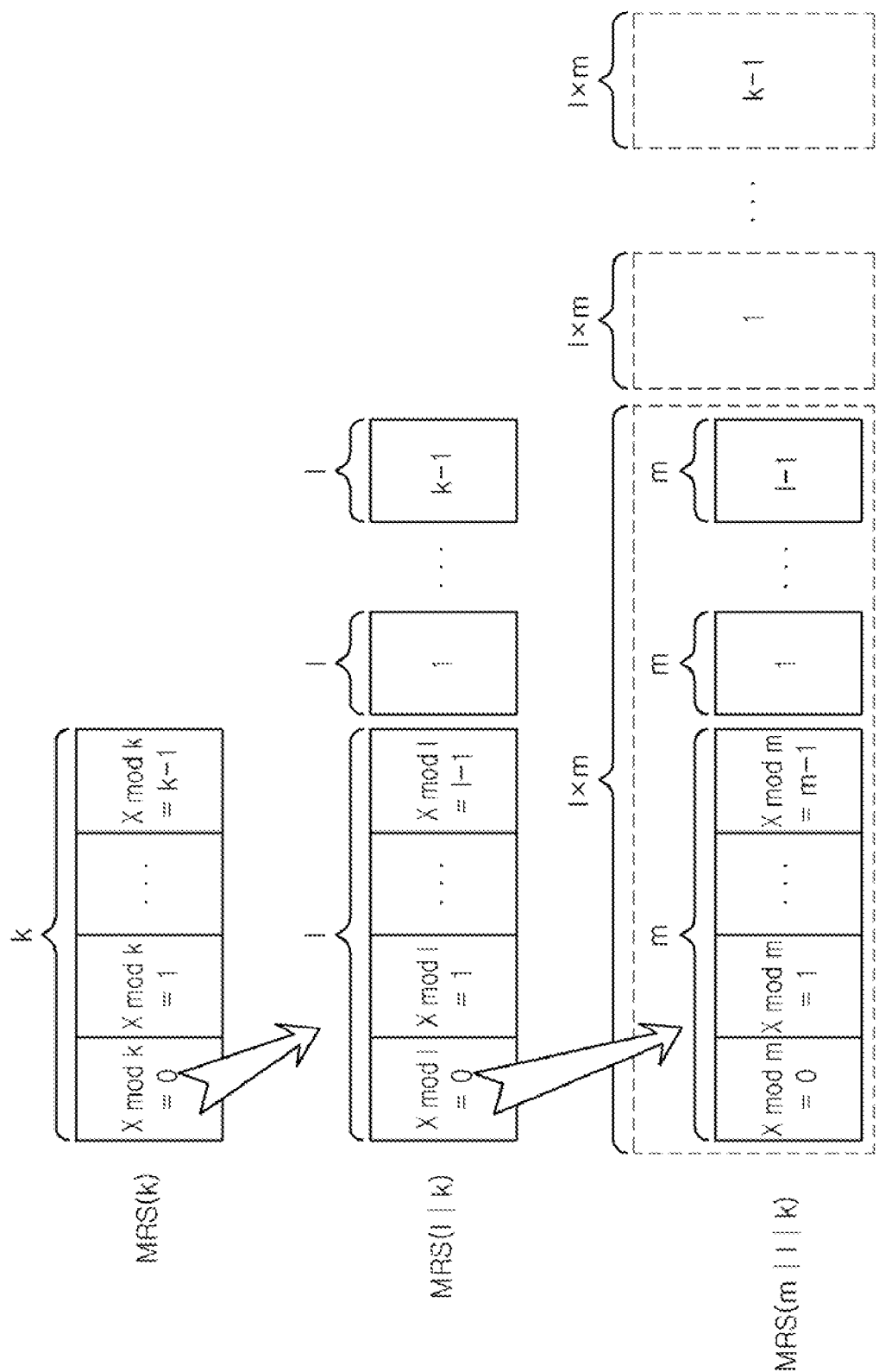

[Fig 4]
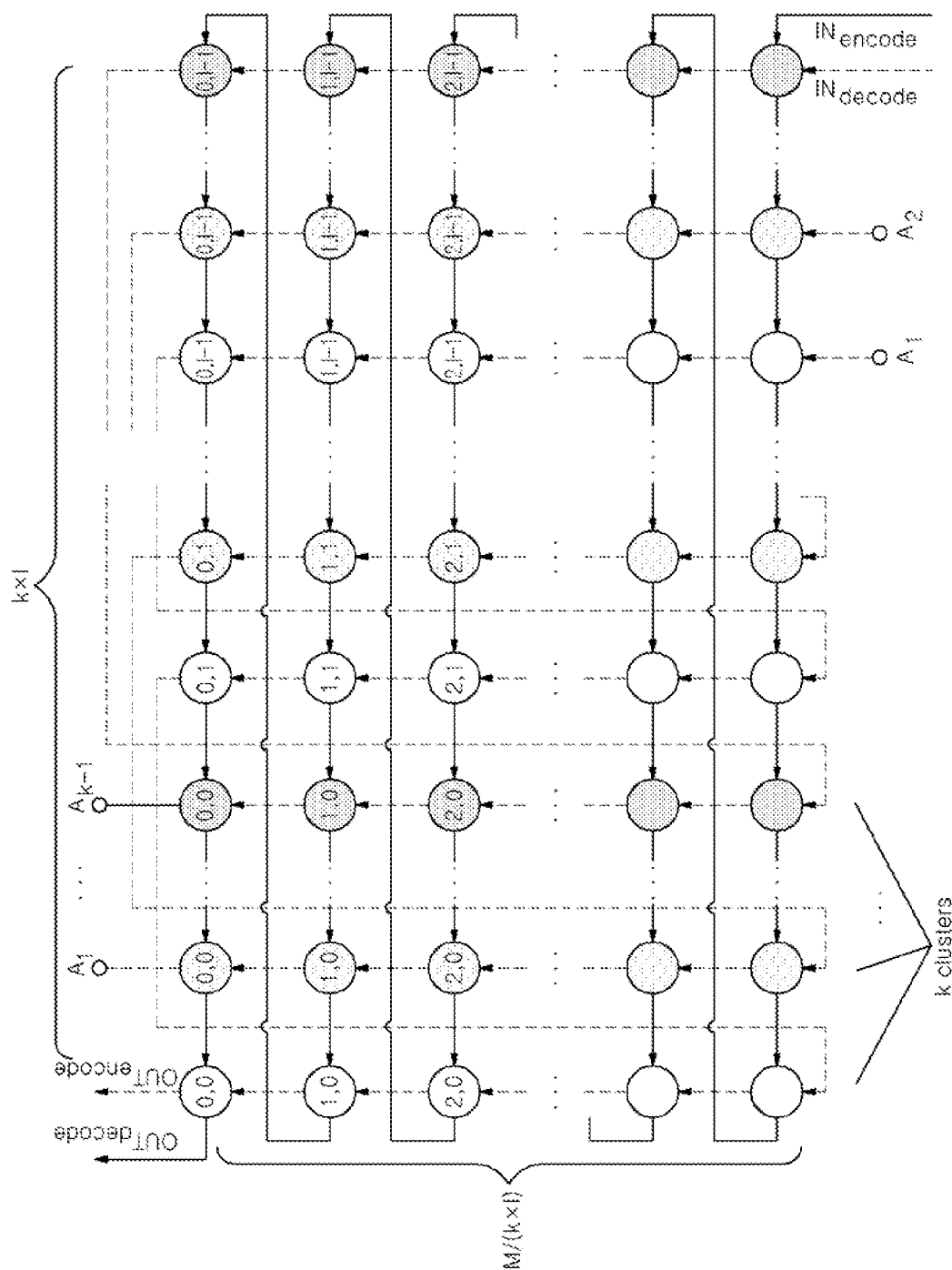

[Fig 5]
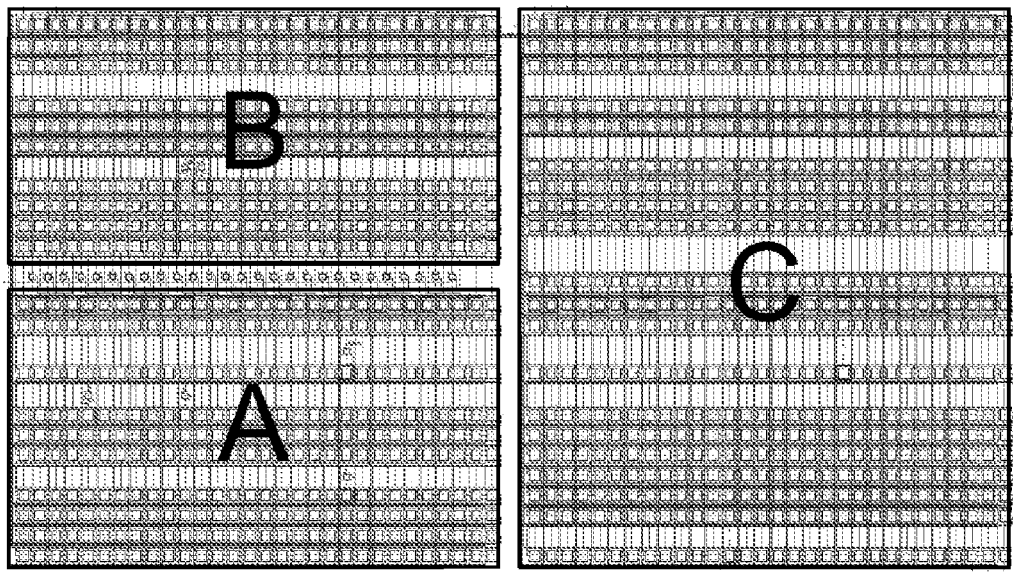
[Fig 6]
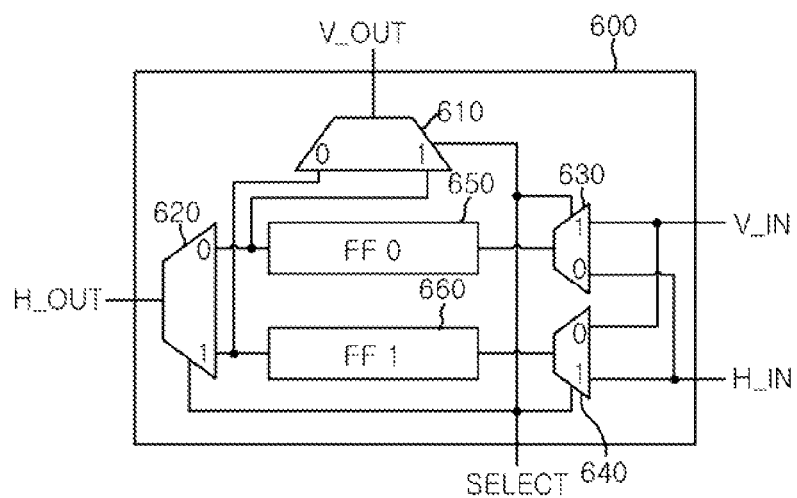

[Fig 7]
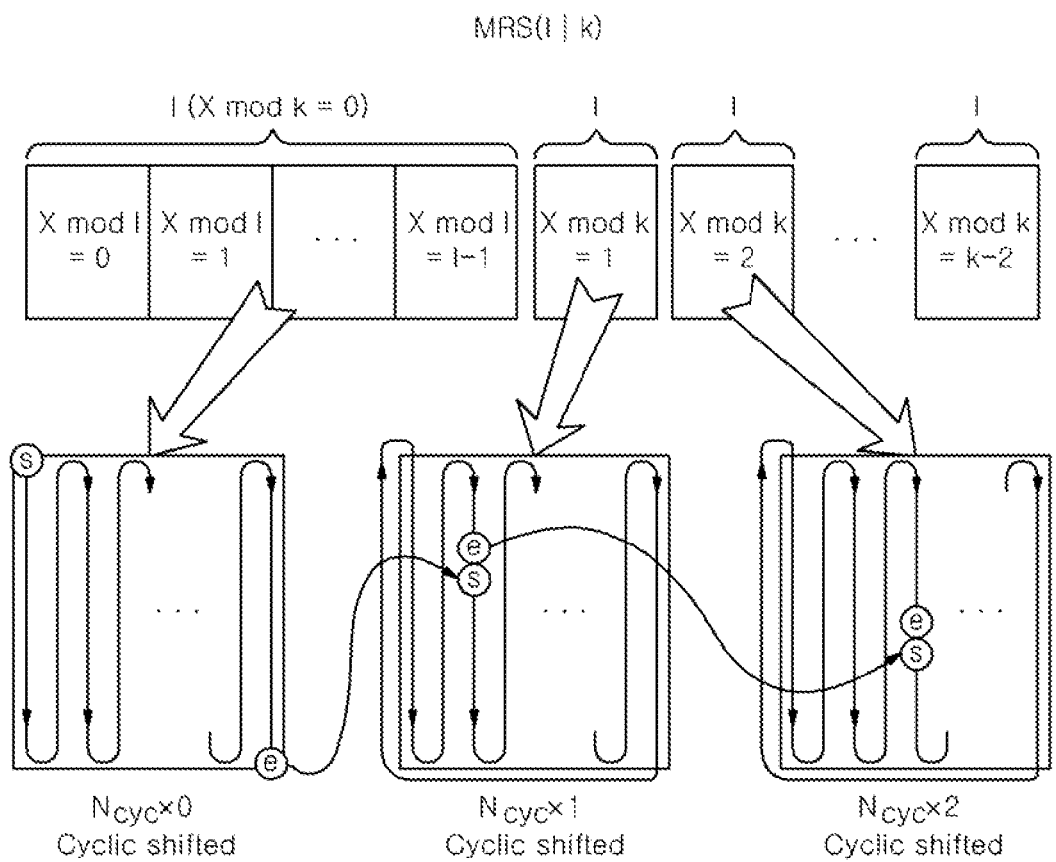

APPARATUS AND METHOD FOR BLOCK INTERLEAVING USING MIXED RADIX SYSTEM IN MB-OFDM

TECHNICAL FIELD

This invention relates to a multi-band orthogonal frequency division multiplexing (MB-OFDM) communication system, and more particularly to an apparatus and method for block interleaving using a mixed radix system in MB-OFDM communication system.

BACKGROUND ART

MB-OFDM communication system is being widely used as one of standards for UWB (Ultra Wide Band) systems. The MB-OFDM system has the characteristic of low power consumption and data transfer rate up to 480 Mbps. Requirements for such performances make it difficult for system developers to implement MB-OFDM systems.

Interleaver is one of the most important elements used in most communication systems as well as the MB-OFDM systems. The interleaver performs an interleaving process of rearranging input bit sequences such that they are not adjacent each other, in order to increase robustness to burst errors in a data transmission channel.

The interleaver of the MB-OFDM system performs three successive sub-processes: symbol interleaving, tone interleaving and cyclic shift.

FIG. 1 shows a block diagram for a structure of general interleaver. Referring to FIG. 1, an interleaver 100 includes a symbol interleaving part 110, a tone interleaving part 120, a cyclic shifting part 130 and two memories 140 and 150. An input signal to be transmitted is subjected to three-phase processes of symbol interleaving, tone interleaving and cyclic shift in the interleaver 100. The first and second memories 140 and 150 serve as buffers for temporarily storing data produced by the interleaving sub-processes.

The interleaving sub-processes may be expressed as the following Equations 1 to 3 representing symbol interleaving, tone interleaving and cyclic shift, respectively, as follows:

$$a_S[i] = a\left[\left\lfloor \frac{i}{N_{CBPS}} \right\rfloor + \frac{6}{N_{TDS}} \times \text{mod}(i, N_{CBPS})\right] \quad \text{[Equation 1]}$$

$$a_T[i] = a_S\left[\left\lfloor \frac{i}{N_{Tint}} \right\rfloor + 10 \times \text{mod}(i, N_{Tint})\right] \quad \text{[Equation 2]}$$

$$b[i] = a_t[m(i) \times N_{CBPS} + \text{mod}(i + m(i) \times N_{cyc}, N_{CBPS})] \quad \text{[Equation 3]}$$

In the above equations, a, $a_S$, $a_T$ and b represent input bits to the interleaver 100, output bits from the symbol interleaving part 110, output bits from the tone interleaving part 120 and output bits from the cyclic shifting part 130, respectively. m(i) $\lfloor i/N_{CBPS} \rfloor$, and $N_{CBPS}$, $N_{TDS}$, $N_{Tint}$ and $N_{cyc}$ are constant values related to data rate in the MB-OFDM system.

TABLE 1

| Data Rate (Mb/s) | TDS Factor ($N_{TDS}$) | Coded Bits/ OFDM Symbol ($N_{CBPS}$) | Tone Interleaver Block Size ($N_{Tint}$) | Cyclic Shift ($N_{cyc}$) |
|---|---|---|---|---|
| 53.3 | 2 | 100 | 10 | 33 |
| 80 | 2 | 100 | 10 | 33 |
| 106.7 | 2 | 200 | 20 | 66 |
| 160 | 2 | 200 | 20 | 66 |
| 200 | 2 | 200 | 20 | 66 |
| 320 | 1 | 200 | 20 | 33 |
| 400 | 1 | 200 | 20 | 33 |
| 480 | 1 | 200 | 20 | 33 |

In general, the three-phase processes are implemented with dedicated memories (for example, 140 and 150 in FIG. 1) such as interface buffers that temporarily store results of the sub-processes. Since the sub-processes have to be performed in series, delay and performance of the interleaver are determined by the sum of performance matrices of the sub-processes. For example, the general interleaver shown in FIG. 1 produces a total of eight-symbol delay, which consist of six-symbol delay for the symbol interleaving, one-symbol delay for the tone interleaving and one-symbol delay for the cyclic shift.

As one of measures taken to avoid such a delay, a pipeline structure may be considered to improved system performance. However, this pipeline approach requires a memory system which is even more complicated than that of a non-pipeline approach. Moreover, this pipeline approach has a demerit of high power consumption.

DISCLOSURE

Technical Problem

It is an object of the invention to provide an apparatus and method for block interleaving using a mixed radix system, which is capable of reducing the time delay in an interleaving process in an MB-OFDM communication system.

It is another object of the invention to provide an apparatus and method for block interleaving using a mixed radix system, which is capable of reducing complexity in implementation of interleaving in an MB-OFDM communication system.

It is still another object of the invention to provide an apparatus and method for block interleaving using a mixed radix system, which is capable of reducing power consumption in implementation of interleaving in an MB-OFDM communication system.

Technical Solution

To accomplish the objects above, according to the first aspect of the invention, there is provided a block interleaving apparatus for block interleaving M-bit input streams to be transferred with a modulus k using a mixed radix system in a multi-band orthogonal frequency division multiplexing communication system, including: an array processor having an array including M cells in which the number of columns is k and the number of rows is M/k. The array processor inputs the input streams from the bottom-right cell up to the top-left last cell in horizontal direction. After the first bit of the input streams reaches the last cell, the processor generates interleaved output streams by changing an output from the array processor from the horizontal direction to vertical direction.

Preferably, each of the cells includes: a switch for selecting between horizontal and vertical directions of the input streams according to select signals; a first storing unit for storing the input streams in the vertical direction according to the vertical direction select signal; a second storing unit for storing the input streams in the horizontal direction according to the horizontal direction select signal; a first multiplexer for outputting an output stream from one of the first and second storing units in the vertical direction according to the vertical direction select signal; and a second multiplexer for outputting an output stream from the other of the first and second storing units in the horizontal direction according to the horizontal direction select signal.

Preferably, the first storing unit and the second storing unit each includes a flip-flop that stores one-bit information.

Preferably, the switch includes: a third multiplexer for outputting the input streams in the vertical direction to the first storing unit according to the vertical direction select signal, and outputting the input streams in the horizontal direction to the first storing unit according to the horizontal direction select signal; and a fourth multiplexer for outputting the input streams in the vertical direction to the second storing unit according to the vertical direction select signal, and outputting the input streams in the horizontal direction to the second storing unit according to the horizontal direction select signal.

Preferably, the array processor is connected to one or more different array processors having the same size of array to extend the size of block to be interleaved.

According to the second aspect of the invention, there is provided a block interleaving apparatus for block interleaving M-bit input streams to be transferred with a modulus k using a mixed radix system in a multi-band orthogonal frequency division multiplexing communication system, including: an array processor having an array including M cells in which the number of columns is k×l and the number of rows is M/(k×l). The array processor inputs the input streams from the bottom-right cell up to the top-left last cell in a horizontal direction. After the first bit of the input streams reaches the last cell, the array processor generates interleaved output streams by changing an output from the array processor from the horizontal direction to a vertical direction.

Preferably, the array processor performs symbol interleaving with modulus k and tone interleaving with a modulus I simultaneously.

Preferably, each of the cells includes: a switch for selecting one of the horizontal and vertical directions of the input streams according to select signals; a first storing unit for storing the input streams in the vertical direction according to the vertical direction select signal; a second storing unit for storing the input streams in the horizontal direction according to a horizontal direction select signal; a first multiplexer for outputting an output stream from one of the first and second storing units in the vertical direction according to the vertical direction select signal; and a second multiplexer for outputting an output stream from the other of the first and second storing units in the horizontal direction according to the horizontal direction select signal.

Preferably, the first storing unit and the second storing unit each includes a flip-flop that stores one-bit information.

Preferably, the switch includes: a third multiplexer for outputting the input streams in the vertical direction to the first storing unit according to the vertical direction select signal, and outputting the input streams in the horizontal direction to the first storing unit according to the horizontal direction select signal; and a fourth multiplexer for outputting the input streams in the vertical direction to the second storing unit according to the vertical direction select signal, and outputting the input streams in the horizontal direction to the second storing unit according to the horizontal direction select signal.

Preferably, the array processor is connected to one or more different array processors having the same size of array to extend the size of block to be interleaved.

Preferably, in the cells, the input streams are cyclically shifted by connecting arrays of the cells, which are distinguished by the modulus k, between selected specific positions.

According to the third aspect of the invention, there is provided a block interleaving method for block interleaving M-bit input streams to be transferred with a modulus k using a mixed radix system in a multi-band orthogonal frequency division multiplexing communication system, including the steps of: configuring an array processor having an array including M cells in which the number of columns is k and the number of rows is M/k; inputting the input streams from a bottom-right cell up to the top-left last cell in a horizontal direction; and, after the first bit of the input streams reaches the last cell, generating interleaved output streams by changing an output from the array processor from horizontal direction to vertical direction.

Preferably, the array processor is connected to one or more different array processors having the same size of array to extend the size of block to be interleaved.

According to the fourth aspect of the invention, there is provided a block interleaving method for block interleaving M-bit input streams to be transferred with a modulus k using a mixed radix system in a multi-band orthogonal frequency division multiplexing communication system, including the steps of: configuring an array processor having an array including M cells in which the number of columns is k×l and the number of rows is M/(k×l); inputting the input streams from the bottom-right cell up to the top-left last cell in a horizontal direction. After the first bit of the input streams reaches the last cell, the array processor generates interleaved output streams by changing an output from the array processor from the horizontal direction to a vertical direction.

Preferably, the array processor performs symbol interleaving with a modulus k and tone interleaving with a modulus I simultaneously.

Preferably, the array processor is connected to one or more different array processors having the same size of array to extend the size of block to be interleaved.

Preferably, in the cells, the input streams are cyclically shifted by connecting arrays of the cells, which are distinguished by the modulus k, between selected specific positions.

ADVANTAGEOUS EFFECTS

According to the invention, it is possible to design an interleaver in a modular and extensive manner by applying the MRS system.

Since the interleaver of the invention can be implemented with an array processor structure, it is possible to configure cells of the array processor with a simple logic including two one-bit storage spaces (for example, flip-flops) and a switch. In addition, the structure of the interleaving process can support a deinterleaving process without any change in design.

The suggested interleaver structure is superior to the general structure in terms of delay, complexity and power consumption. Specifically, with the suggested interleaver structure, in comparison to conventional structures, the delay is the minimum of 6 MB-OFDM symbols, the complexity is reduced by 69.4% for the data transfer rate of 200 Mbps and by 40.3% for the data transfer rate of 480 Mbps, the maximum clock frequency is improved 3.38 times, and the power consumption is reduced by 73.6% for the data transfer rate of 200 Mbps and by 39.8% for the data transfer rate of 480 Mbps.

BRIEF DESCRIPTION OF THE DRAWINGS

FIG. 1 is a block diagram showing a structure of a general interleaver.

FIG. 2 is a view showing an interleaving and deinterleaving processor in an MRS according to an embodiment of the invention.

FIG. 3 is a view showing the extension of the concept shown in FIG. 2 in an MRS according to an embodiment of the invention.

FIG. 4 is a view showing an interleaving and deinterleaving processor obtained by applying the extended concept shown in FIG. 3 to the interleaving and deinterleaving processor shown in FIG. 2 according to an embodiment of the invention.

FIG. 5 is a schematic view showing an array processor that supports all data transfer rates according to an embodiment of the invention.

FIG. 6 is a view showing a detailed structure of one of cells shown in FIG. 5 according to an embodiment of the invention.

FIG. 7 is a view showing the concept of cyclic shift according to an embodiment of the invention.

MODE FOR INVENTION

The present invention suggests a novel interleaving method for an MB-OFDM system based on a mixed-radix system (MRS), which facilitates implementation of an interleaver with an array processor including cells, each of which is composed of two flip-flops and a simple digital logic.

In the invention, a mathematical relationship between the MRS and an interleaving process is derived to conceptually demonstrate that the MRS can be applied to the interleaving process. A method for designing an interleaver based on the MRS has a completely hierarchical structure. Accordingly, a method for implementing the interleaver of the invention supports all data transfer rates and modular design which are required for the MB-OFDM system. A deinterleaving process may use the same array processor as the interleaving process without any change in design.

The delay due to the interleaving process of the invention corresponds to 6 MB-OFDM symbols at the minimum. The interleaver of the invention reduces complexity by 69.4% for a data transfer rate of 200 Mbps and by 40.3% for a data transfer rate of 480 Mbps, increases the maximum clock frequency 3.38 times as high as that in conventional methods, and reduces power consumption by 73.6% for a data transfer rate of 200 Mbps and by 39.8% for a data transfer rate of 480 Mbps.

The present invention suggests a novel array processor to perform the interleaving process using the MRS. A permutation operation for both of the symbol interleaving and the tone interleaving process, which are respectively expressed as the above Equations 1 and 2, is basically performed using a modular operation.

The MRS is mainly used in the field of engineering (for example, a parallel processing architecture for FFT and RNS transformation, etc.). The present invention is essentially different from the conventional techniques in that a cell processing unit in the array processor uses a simple switching logic instead of an array memory. Accordingly, the method of implementing the interleaving process according to the present invention provides a lower delay, less power consumption and less complexity as compared to the conventional methods.

The present invention has three main principal aspects. First, a mathematical relationship between the MRS and the interleaving process is derived, and a structure of an array processor based on the MRS is proposed. Second, the method of implementing the interleaving process can satisfy all data transfer requirements shown in Table 1 because of low delay. Finally, complete modulation facilitates implementation of an interleaver with high performance.

Hereinafter, preferred embodiments of the invention will be described with reference to the accompanying drawings. In the following detailed description of the present invention, concrete description on related functions or constructions will be omitted if it is deemed that the functions and/or constructions may unnecessarily obscure the gist of the present invention.

In the following detailed description, first, the MRS and the interleaving process will be first described in brief and the mathematical relationship between the MRS and the interleaving process is derived. Next, a brief structure of the interleaver using an MRS structure according to the present invention, a detailed structure thereof, and evaluation of performance of the interleaver of the present invention will be described in order.

<Application of MRS to Interleaving>

From a standpoint of bit position, an interleaving bit sequence subjected to a modular operation alleviates a transmission problem ranging from an essential decimal number system (DNS) to bits interleaved through the MRS. Deinterleaving is an inverse transformation process of transforming positions of interleaved bits into their original positions through another MRS which is a transformation of the MRS for interleaving. Hereinafter, it will be demonstrated that the interleaving process can be expressed by a number system transformation.

The MRS will be first described in brief.

The MRS is one of the most well-known mathematical systems for changing positions of bits through basic numerical transformation. In an n-radix MRS $(p_n | \ldots | p_1)$, number X of DNS is expressed by the following Equation 4:

$$X = <a_n | a_{n-1} | a_0> \qquad \text{[Equation 4]}$$

The above Equation 4 may be arranged as the following Equation 5.

$$X = \sum_{k=0}^{n} a_k w_k \qquad \text{[Equation 5]}$$

$w_k$ in the above Equation 5 may be expressed by the following Equation 6.

$$w_k = \begin{cases} 1 & \text{for } k = 0 \\ \prod_{i=1}^{k} p_i & \text{for } 0 < k \leq n \end{cases} \qquad \text{[Equation 6]}$$

In the above Equations 5 and 6, $p_i$ is radices, $w_k$ is a weight value, and $a_k$ is a mixed-radix digit. If $p_i = 10$, the MRS is expressed by a decimal system. Any number within a range of $0 \leq X < M$ in the MRS is ensured to have its unique expression, and M has a dynamic range.

Next, a technique for implementing the interleaving process using the MRS based on a digit-reversal permutation will be described.

<Interleaving/Deinterleaving with Application of MRS>

A DNS sequence a at a position i may be expressed by a MRS($p_1$) sequence β as the following Equation 7.

$$a[i] = \beta\left[\left\lfloor \frac{i}{p_i} \right\rfloor, \mod(i, p_i)\right] \quad \text{[Equation 7]}$$

i in the DNS is expressed by $<\lfloor i/p_i \rfloor \mod(i,p_i)>$ in MRS($p_1$).

It is assumed that positions of digits in the MRS($p_1$) sequence are transformed into new positions of digits in a MRS($p'_1$) sequence in a two-dimensional array before the MRS($p_1$) sequence is again transformed into the DNS sequence.

A new form of DNS sequence α'[i] may be produced by the MRS($p'_1$) as the following Equations 8 and 9.

$$\beta'[j,k] = \beta[k,j] \quad \text{[Equation 8]}$$

$$\alpha'[i] = \beta'\left[\left\lfloor \frac{i}{p'_1} \right\rfloor, \mod(i, p'_1)\right] \quad \text{[Equation 9]}$$

β'[j,k] is a digit-reversal MRS in a new radix ($p'_1$).

Finally, a relationship between the new DNS and the original DNS which was calculated from Equations 7 and 8 β[j,k] (=α[j×$p_1$+k]) is derived as the following Equation 10.

$$\alpha'[i] = \beta\left[\mod(i, p'_1), \left\lfloor \frac{i}{p'_1} \right\rfloor\right] \quad \text{[Equation 10]}$$

$$= \alpha\left[\left\lfloor \frac{i}{p'_1} \right\rfloor + p_1 \times \mod(i, p'_1)\right]$$

It can be seen that the derived Equation 10 has the same form as Equations 1 and 2. Interleaving/deinterleaving can be described with transformation of two-dimensional array into MRS using two modulos $p_1$ and $p'_1$.

<Interleaving/Deinterleaving Processor for MB-OFDM>

Hereinafter, a structure and operation of an interleaving/deinterleaving processor for performing a number system transformation for MB-OFDM will be described.

FIG. 2 shows an array processor that interleaves M bits through modular operation with coefficients k. Here, M is the number of cells in the array processor. The array processor is composed of a two-dimensional array having the size of $$\left(\frac{M}{k} \times k\right),$$

and each cell is connected to four adjacent cells. Each cell receives an input from bottom-right adjacent cells and transmits an output to top-left adjacent cells. For example, a cell $C_{1,1}$ receives inputs from cells $C_{1,2}$ and $C_{2,1}$, and transmits outputs to cells $C_{1,0}$ and $C_{0,1}$. With such a structure, the array processor are able to transmit input bits in horizontal (right to left) and vertical (bottom to top) directions.

In the case of interleaving with MRS(k), the array processor transmits input data from $IN_{encode}$ to the last cell $C_{0,0}$ located at the top-left edge along a solid line in the horizontal direction. An individual bit at an X-th position is located at its unique cell $C_{a1,a0}$. Here, X=$a_1$×k+$a_0$. The position may be expressed by $<a_1|a_0>$ in the MRS(k).

After the first bit of an input stream reaches the last cell, the array processor changes a direction from the horizontal direction to the vertical direction along a dotted line to produce an interleaved output. The array processor transforms positions of bits in MRS(M/k) into DNS with interleaved positions of bits. At that time, the array processor performs a digit-reversal permutation algorithm as described above. More specifically, the interleaving process includes the following three transformation procedures: MRS(k) in DNS; digit-reversal transformation in MRS(k); and interleaved DNS in MRS(M/k).

Likely, the deinterleaving may be performed in the same way as the interleaving. However, in the deinterleaving, the transformation is performed from MRS(M/k) to MRS(k) in the same structure. The deinterleaving process starts from $IN_{decode}$ along the dotted line in the vertical direction, and deinterleaved bits are outputted along the solid line in the vertical direction.

The above structure can be easily extended to implement a p-successive modular permutation of MRS($p_\mu|\ldots|p_2|p_1$). This is because the structure can be expressed by one 1-radix MRS($p_\mu \times \ldots \times p_2 \times p_1$). The successive modular permutation may be also be implemented to a serial configuration of 1-radix MRS($p_i$).

FIG. 3 shows a method of extending one-radix MRS(k) to a successive modular permutation MRS(m|l|k).

In general, two-successive modular permutations shown in Equations 1 and 2 can be expressed by a serial structure of two 1-radix MRSs with k=6/$N_{TDS}$ in the symbol interleaving process and l=10 in the tone interleaving process. In the present invention, 1-radix MRS(k×l) is extended to 2-radix MRS(l|k) instead of dependently using two interleaving blocks in series.

FIG. 4 shows a structure extended to MRS(l|k). This structure combines the symbol interleaving process and the tone interleaving process into one process. That is, although this structure is similar to that shown in FIG. 2, it is achieved by applying the extension shown in FIG. 3 to the structure shown in FIG. 2. Colors (distinguished by brightness and darkness of white, gray and black) connected vertically in FIG. 4 represent permutation in MRS(k). A cell $C_{a2,a1}$ having $a_0$ color (brightness and darkness) represents an X-th bit position in DNS, and X is transformed into $<a_2|a_1|a_0>$ in MRS(l|k) in a two-dimensional array. In this case, X=$a_2$×l×k+$a_1$×k+$a_0$.

The array processor performs the interleaving/deinterleaving process using a method similar to that of the 1-radix MRS processor shown in FIG. 2. The transformation is a transformation from MRS(l|k) into MRS(l|M/(l×k)) in the interleaver and a transformation from MRS(l|M/(l×k)) into MRS(l|k) in the deinterleaver. Differently from FIG. 2, in an aspect of output generation, all cells with the same color (brightness and darkness) have to be processed to the last before an output is received from different colors (brightness and darkness). This process is implemented by interconnection between cells with the same color (brightness and darkness) in FIG. 4. $A_t$ represents interconnection between different colors (brightness and darkness) (that is, $a_0$ in MRS(l|k)).

Although the overall interleaving process includes the three sub-processes of the symbol interleaving, the tone interleaving and the cyclic shi as described above, the processor shown in FIG. 4 only perform the first two successive sub-processes (that is, the symbol interleaving and the tone interleaving). The last sub-process (i.e., the cyclic shift) not included in the MRS and DNS transformation can be implemented by simply changing the basic structure of the processor, which will be described later.

<Hardware Implementation>

Hereinafter, a method for the actual implementation of the interleaver for MB-OFDM system using an MRS on FPGA (Field-Programmable Gate Array) will be described. The following Table 2 shows characteristic parameters of block interleaving for the MB-OFDM system.

TABLE 2

| Data Rate (Mb/s) | Block Size | 1st Modulus ($m_1$) | 2nd Modulus ($m_2$) |
| --- | --- | --- | --- |
| 53.3 | 300 | 3 | 10 |
| 80 | 300 | 3 | 10 |
| 106.7 | 600 | 3 | 10 |
| 160 | 600 | 3 | 10 |
| 200 | 600 | 3 | 10 |
| 320 | 1200 | 6 | 10 |
| 400 | 1200 | 6 | 10 |
| 480 | 1200 | 6 | 10 |

In Table 2, the first column represents the data transfer rates that is supported in the system. The second column represents block sizes for each specific data transfer rate determined by the number of cells in the array processor. The remaining columns represent 1st ($m_1$) and second 2nd ($m_2$) modulus used for two successive modular operations in the symbol interleaving and tone interleaving sub-processes. The two modulus $m_1$ and $m_2$ may be considered as k and l in Table 2. Next, considerations on implementation which are required to support a variety of characteristics in Table 2 will be described.

FIG. 5 illustrates a schematic view showing an interleaver suggested to support all date transfer rates shown in Table 2. This hardware consists of three parts, A, B and C, which have bit block sizes of 300, 600 and 1200, respectively. First, the bottom-left part A may be used to support interleaving for the block size of 300 used for a data transfer rate of less than 80 Mbps. Second, the top-left part B may be used in extension to support interleaving for the block size of 600 used for a data transfer rate of from 80 Mbps to 200 Mbps. Finally, the right part C may be additionally used to support interleaving for the block size of 1200 used for a data transfer rate of more than 200 Mbps. Additionally, multiplexers may be used to select blocks depending on different block sizes.

Hitherto, the structure shown in FIG. 4 for the successive symbol interleaving and tone interleaving with the modulus of k and l has been described. However, a structure on actual implementation has not directly been used to provide a modulo design to facilitate the implementation. In other words, two array processors with 600 cells of MRS(10|3) have been used in combination instead of MRS(10|6). At this time, a controller is added to control the two array processors to operate every three bits according to the 1st modulus k while the two array processors are receiving input bits at the data transfer rate of more than 200 Mbps. Then, an interleaved bit stream is outputted by connecting output streams from the two array processors. Accordingly, it is possible to provide the same function as the array processor in MRS(10|6) by means of the controller.

FIG. 6 shows a structure of each cell in the array processor shown in FIG. 5. A cell 600 includes two flip-flops (first flip-flop 650 and second flip-flop 660), two multiplexers (first multiplexer 610 and second multiplexer 620), and a switch. The switch may be implemented by two multiplexers (third multiplexer 630 and fourth multiplexer 640) operated according to a select signal.

If the flip-flops 650 and 660 are configured as one-bit storage space in each cell, they may be replaced with any suitable storage medium. In the following description, flip-flops will be described as an example of one-bit storage space.

One input bit is stored in one flip-flop while an output bit is generated from a different flip-flop. The function of these flip-flops are interchanged according to the select signal which determines whether a flip-flop is to be used for an input or an output. V_OUT and V_IN are used for vertical shift of a bit stream while H_OUT and H_IN are used for horizontal shift of the bit stream.

By using the flip-flops for input and output in an interchangeable manner, the array processor according to the embodiment of the invention can implement the overall block interleaving by only a delay of 6 MB-OFDM symbols. That is, each cell outputs an interleaved bit sequence through one flip-flop for a period of time corresponding to 6 symbols and outputs the interleaved bit sequence through another flip-flop for a period of time corresponding to next 6 symbols. The one flip-flop is used to store new input bits while the another flip-flop is being used for the output. Accordingly, the above structure does not produce an additional delay of more than 6 MB-OFDM symbols. The 6 MB-OFDM symbols correspond to the minimum delay time for the interleaving process.

The array processor shown in FIG. 6 may be implemented by the following 'Verilog HDL' algorithm.

```
reg [1:0] FF;
assign H_OUT = SELECT ? FF[1] : FF[0];
assign V_OUT = SELECT ? FF[0] : FF[1];
always @(posedge CLOCK or negedge nCLEAR)
begin
if(!nCLEAR) begin
    FF <=2'b00;
end
else begin
    if(SELECT) begin
       if(H_EN) FF[1] <=H_IN;
       if(V_EN) FF[0] <=V_IN;
    end
    else begin
       if(H_EN) FF[0] <=H_IN;
       if(V_EN) FF[1] <=V_IN;
    end
end
end
```

<Extension of Cyclic Shift>

Since the array processor shown in FIG. 4 was designed to perform only the symbol interleaving and tone interleaving sub-processes, the array processor is required to be extended to support an additional sub-process (that is, cyclic shift) in an interleaving algorithm. The cyclic shift in the MB-OFDM was described in relation to Equation 3. In order to cyclically shifting the bit sequences interleaved by the two previous sub-processes with the parameter $N_{cyc}$ shown in Table 1, several lines are connected to add several multiplexers.

FIG. 7 shows a cyclic shift between three bit sequences characterized as a result of the modular operation (X mod k). Here, X represents a position of each bit in the first input bit sequence. Taking bit sequences from ($N_{cyc} \times 0$)-th position, ($N_{cyc} \times 1$)-th position and ($N_{cyc} \times 2$)-th position, these bit sequences are cyclically shifted. The end point e of the first bit sequence is connected to the starting point s of the second bit sequence, and the end point of the second bit sequence is connected to the starting point of the third bit sequence. Such connection allows implementation of cyclic shift for the three bit sequences.

In the implementation of the array processor, for example, if 33-bit cyclic shift is applied to a bit sequence of gray color in FIG. 4, V_OUT of a 34-th cell is connected, as a successor, to V_IN of the last cell in a bit sequence of white color. V_IN of the last cell in the bit sequence of the gray color is connected to V_OUT of the first cell. In the same way, the 33-rd cell in the gray sequence is connected to a 67-th cell in the next bit sequence.

<Analysis of Performance>

In the above, the structure suggested using 'Verilog HDL' was implemented to show a merit of the suggested structure in terms of performance and complexity. Then, analysis for the structure was made with 'Xilinx-ISE,' and the structure was targeted to 'Xilinx Virtex-4XC4VLX100-10FF1148 FPGA logic.' A general interleaver structure was employed as a basic structure for comparison of performance and complexity of the suggested structure. The general structure combined multiple permutations with pipeline processing to improve the performance. The general structure uses the multiple permutations cyclically and uses a RAM for storage of results of the cyclic permutations. The general structure can also support data transfer rates of 200 Mbps and 480 Mbps.

The following Table 3 shows the performance and complexity of the suggested structure and the general structure.

TABLE 3

|  | Max Clock Frequency | Logic Elements | Latency |
| --- | --- | --- | --- |
| conventional | 148.32 | 4161 | 8 symbols |
| Proposed(200 Mbps) | 501.253 | 1274 | 6 symbols |
| Proposed(480 Mbps) | 500.5 | 2484 | 6 symbols |

The suggested structure reduces the complexity by 69.4% for the data transfer rate of 200 Mbps and by 40.3% for the data transfer rate of 480 Mbps. On the other hand, the suggested structure improves the maximum clock frequency 3.38 times as high as the general structure. The minimum clock frequency of the suggested structure is 500 MHz, which facilitates implementation of an interleaver with a data transfer rate of 480 Mbps. Additionally, the suggested structure provides a delay corresponding to 6 MB-OFDM symbols while the general structure provides a delay corresponding to 8 MB-OFDM symbols.

The following Table 4 shows comparison of power consumption between the general structure and the suggested structure.

TABLE 4

|  | Clock Power (mM) | Logic Power (mM) | Signal Power (mM) | Total Power (mM) |
| --- | --- | --- | --- | --- |
| conventional | 11.29 | 280.43 | 196.87 | 488.59 |
| Proposed(200 Mbps) | 9.60 | 68.00 | 50.62 | 129.21 |
| Proposed(480 Mbps) | 17.48 | 224.34 | 52.39 | 294.21 |

An operation clock frequency is 132 MHz, which is mainly used in the MB-OFDM system to support data transfer rates of 200 Mbps and 480 Mbps. Power consumption of the two structures was measured using 'Xilinx XPower tool.' It was assumed that inputs appear randomly under presumption of worst toggle ratio on a circuit. In the case of data transfer rate of 200 Mbps, the suggested structure consumes only 24.1% of logic power consumed in the general structure. This is because the suggested structure uses only 28.8% LUT as compared to the general structure. In total, the suggested structure consumes about 26% of power consumed in the general structure. In the case of data transfer rate of 480 Mbps, the suggested structure consumes logic power consumption two times with increased number of LUTs as compared to the general structure. However, in total, the suggested structure consumes only 60.2% of power consumption in the general structure.

Hitherto, a novel interleaver structure for a MB-OFDM system according to the invention has been described. The above-described interleaver of the invention used the MRS system to support a design in a modular and extensive manner. To this end, the mathematical relationship between the interleaving process and the MRS was derived, and the array processor structure was suggested to effectively support the interleaving process based on the derivation.

As described above, each cell in the implemented array processor is composed of a simple logic including two 1-bit storage spaces (for example, flip-flops) and a switch. In addition, the structure of the interleaving process are able to support the deinterleaving process without any change in design.

As a result, the suggested interleaver structure is superior to the general structure in terms of delay, complexity and power consumption. Specifically, in the suggested interleaver structure, in comparison to the general structure, the delay is the minimum of 6 MB-OFDM symbols, the complexity is reduced by 69.4% for the data transfer rate of 200 Mbps and by 40.3% for the data transfer rate of 480 Mbps, the maximum clock frequency is improved 3.38 times as high, and the power consumption is reduced by 73.6% for the data transfer rate of 200 Mbps and by 39.8% for the data transfer rate of 480 Mbps.

While the present invention has been particularly shown and described with reference to exemplary embodiments thereof, it will be understood by those skilled in the art that various changes in form and details may be made therein without departing from the spirit and scope of the present invention as defined by the appended claims and equivalents thereof.

The invention claimed is:

1. A block interleaving apparatus for block interleaving M-bit input streams to be transferred with a modulus k, using a mixed radix system in a multi-band orthogonal frequency division multiplexing communication system, comprising:
    an array processor having an array including M cells in which the number of columns is k and the number of rows is M/k,
    wherein the array processor inputs the input streams from the bottom-right cell up to the top-left last cell in horizontal direction, and, after the first bit of the input streams reaches the last cell, generates interleaved output streams by changing the output of the array processor from horizontal direction to vertical direction.

2. The block interleaving apparatus according to claim 1, wherein each of the cells comprises:
    a switch for selecting between horizontal and vertical directions of the input streams according to select signals;
    a first storing unit for storing the input streams in vertical direction according to the vertical direction select signal;
    a second storing unit for storing the input streams in horizontal direction according to the horizontal direction select signal;
    a first multiplexer for outputting an output stream from one of the first and second storing units in vertical direction according to the vertical direction select signal; and
    a second multiplexer for outputting an output stream from the other of the first and second storing units in horizontal direction according to the horizontal direction select signal.

3. The block interleaving apparatus according to claim 2, wherein the first storing unit comprises a flip-flop that stores one-bit information.

4. The block interleaving apparatus according to claim 2, wherein the second storing unit comprises a flip-flop that stores one-bit information.

5. The block interleaving apparatus according to claim 2, wherein the switch comprises:
 a third multiplexer for outputting the input streams in vertical direction to the first storing unit according to the vertical direction select signal, and outputting the input streams in horizontal direction to the first storing unit according to the horizontal direction select signal; and
 a fourth multiplexer for outputting the input streams in vertical direction to the second storing unit according to the vertical direction select signal, and outputting the input streams in horizontal direction to the second storing unit according to the horizontal direction select signal.

6. The block interleaving apparatus according to claim 1, wherein the array processor is connected to one or more different array processors having the same size of array to extend the size of block to be interleaved.

7. A block interleaving apparatus for block interleaving M-bit input streams to be transferred with a modulus k using a mixed radix system in a multi-band orthogonal frequency division multiplexing communication system, comprising:
 an array processor having an array including M cells in which the number of columns is k×l and the number of rows is M/(k×l),
 wherein the array processor inputs the input streams from the bottom-right cell up to the top-left last cell in horizontal direction, and, after the first bit of the input streams reaches the last cell, generates interleaved output streams by changing the output of the array processor from horizontal direction to vertical direction.

8. The block interleaving apparatus according to claim 7, wherein the array processor performs symbol interleaving with a modulus k and tone interleaving with a modulus l simultaneously.

9. The block interleaving apparatus according to claim 7, wherein each of the cells comprises:
 a switch for selecting between horizontal and vertical directions of the input streams according to select signals;
 a first storing unit for storing the input streams in vertical direction according to the vertical direction select signal;
 a second storing unit for storing the input streams in horizontal direction according to a horizontal direction select signal;
 a first multiplexer for outputting an output stream from one of the first and second storing units in vertical direction according to the vertical direction select signal; and
 a second multiplexer for outputting an output stream from the other of the first and second storing units in horizontal direction according to the horizontal direction select signal.

10. The block interleaving apparatus according to claim 9, wherein the first storing unit comprises a flip-flop that stores one-bit information.

11. The block interleaving apparatus according to claim 9, wherein the second storing unit comprises a flip-flop that stores one-bit information.

12. The block interleaving apparatus according to claim 9, wherein the switch comprises:
 a third multiplexer for outputting the input streams in the vertical direction to the first storing unit according to the vertical direction select signal, and outputting the input streams in the horizontal direction to the first storing unit according to the horizontal direction select signal; and
 a fourth multiplexer for outputting the input streams in the vertical direction to the second storing unit according to the vertical direction select signal, and outputting the input streams in the horizontal direction to the second storing unit according to the horizontal direction select signal.

13. The block interleaving apparatus according to claim 9, wherein the array processor is connected to one or more different array processors having the same size of array to extend the size of block to be interleaved.

14. The block interleaving apparatus according to claim 9, wherein, in the cells, the input streams are cyclically shifted by connecting arrays of the cells, which are distinguished by the modulus k, between selected specific positions.

15. A block interleaving method for block interleaving M-bit input streams to be transferred with a modulus k using a mixed radix system in a multi-band orthogonal frequency division multiplexing communication system, comprising the steps of:
 configuring an array processor having an array including M cells in which the number of columns is k and the number of rows is M/k;
 inputting the input streams from the bottom-right cell up to the top-left last cell in the horizontal direction; and
 after the first bit of the input streams reaches the last cell, generating interleaved output streams by changing the output from the array processor from horizontal direction to vertical direction.

16. The block interleaving method according to claim 15, wherein the array processor is connected to one or more different array processors having the same size of array to extend the size of block to be interleaved.

17. A block interleaving method for block interleaving M-bit input streams to be transferred with a modulus k using a mixed radix system in a multi-band orthogonal frequency division multiplexing communication system, comprising the steps of:
 configuring an array processor having an array including M cells in which the number of columns is k×l and the number of rows is M/(k×l);
 inputting the input streams from the bottom-right cell up to the top-left last cell in the horizontal direction; and
 after the first bit of the input streams reaches the last cell, generating interleaved output streams by changing the output from the array processor from the horizontal direction to the vertical direction.

18. The block interleaving method according to claim 17, wherein the array processor performs symbol interleaving with a modulus k and tone interleaving with a modulus l simultaneously.

19. The block interleaving method according to claim 17, wherein the array processor is connected to one or more different array processors having the same size of array to extend the size of block to be interleaved.

20. The block interleaving method according to claim 17, wherein, in the cells, the input streams are cyclically shifted by connecting arrays of the cells, which are distinguished by the modulus k, between selected specific positions.

* * * * *